US012593720B2

(12) United States Patent
Kimura

(10) Patent No.: US 12,593,720 B2
(45) Date of Patent: Mar. 31, 2026

(54) SEMICONDUCTOR DEVICE COMPRISING ELECTRODE TERMINALS COATED WITH AN INSULATING FILM HAVING A THICKNESS OF LESS THAN 100 MICRONS, METHOD OF MANUFACTURING THE SEMICONDUCTOR DEVICE, AND POWER CONVERSION APPARATUS COMPRISING THE SEMICONDUCTOR DEVICE

(71) Applicant: Mitsubishi Electric Corporation, Tokyo (JP)

(72) Inventor: Yoshitaka Kimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 348 days.

(21) Appl. No.: 18/323,985

(22) Filed: May 25, 2023

(65) Prior Publication Data

US 2024/0087968 A1      Mar. 14, 2024

(30) Foreign Application Priority Data

Sep. 8, 2022      (JP) ................................. 2022-142678

(51) Int. Cl.
H01L 23/053 (2006.01)
H01L 23/24 (2006.01)
H02M 7/5387 (2007.01)

(52) U.S. Cl.
CPC ............ H01L 23/053 (2013.01); H01L 23/24 (2013.01); H02M 7/53875 (2013.01)

(58) Field of Classification Search
CPC ..... H01L 2224/3755; H01L 2224/3756; H01L 2224/37565; H01L 2224/37686–37688;
(Continued)

(56) References Cited

U.S. PATENT DOCUMENTS 2,697,189 A * 12/1954 Stelmak ................. H10D 99/00
257/784
5,310,702 A * 5/1994 Yoshida .................. H01L 24/48
29/827
(Continued)

FOREIGN PATENT DOCUMENTS

CN        107210291 A * 9/2017 ........... H01L 25/072
CN        105514054 B * 6/2018 ....... H01L 23/49827
(Continued)

OTHER PUBLICATIONS

"Notice of Reasons for Refusal" Office Action issued in JP 2022-142678; mailed by the Japanese Patent Office on Aug. 26, 2025.
(Continued)

*Primary Examiner* — Scott B Geyer
(74) *Attorney, Agent, or Firm* — Studebaker Brackett PLLC

(57)        ABSTRACT

An object is to provide a technique that lowers the self-inductance of a semiconductor device. A semiconductor device includes an insulating substrate having a circuit pattern formed on an upper surface thereof, a semiconductor element mounted on the upper surface of the circuit pattern, and a plurality of electrode terminals each having one end portion bonded to the upper surface of the circuit pattern. The electrode terminals having portions of mutual adjacency of the plurality of electrode terminals are coated with the insulating film having a thickness of less than 100 at least at the portions.

9 Claims, 4 Drawing Sheets

(58) Field of Classification Search
  CPC ...................... H01L 2224/3769–37691; H01L
                2224/37786–37791; H01L
                2224/37886–37891; H01L
                2224/37986–37991; H01L
                2224/3757–37578; H01L
        2224/37486–37491; H01L 2224/45541;
        H01L 2224/4555; H01L 2224/4556;
                H01L 2224/45565; H01L
        2224/4557–45578; H01L 2224/45572;
        H01L 2224/4554; H01L 23/28–3192;
        H01L 21/56–568; H01L 2924/181–186;
                H01L 25/0655; H01L 25/072
  See application file for complete search history.

(56)              References Cited

U.S. PATENT DOCUMENTS

|  |  |  |  |  |
|---|---|---|---|---|
| 5,329,421 | A * | 7/1994 | Kuriyama | H01G 9/0003 |
|  |  |  |  | 361/534 |
| 5,430,330 | A * | 7/1995 | Takahama | H01L 21/56 |
|  |  |  |  | 257/788 |
| 5,463,251 | A * | 10/1995 | Fujita | H01L 23/3135 |
|  |  |  |  | 257/E23.101 |
| 5,527,742 | A * | 6/1996 | Weiler | H01L 24/49 |
|  |  |  |  | 29/827 |
| 5,644,281 | A * | 7/1997 | Kuriyama | H01G 9/0003 |
|  |  |  |  | 361/534 |
| 5,656,830 | A * | 8/1997 | Zechman | H01L 23/293 |
|  |  |  |  | 257/784 |
| 5,736,792 | A * | 4/1998 | Orcutt | H01L 24/49 |
|  |  |  |  | 257/772 |
| 5,776,786 | A * | 7/1998 | Nakamura | H01L 24/85 |
|  |  |  |  | 228/904 |
| 5,880,520 | A * | 3/1999 | Ma | H01L 23/495 |
|  |  |  |  | 257/E23.041 |
| 6,177,726 | B1 * | 1/2001 | Manteghi | H01L 23/3135 |
|  |  |  |  | 29/841 |
| 6,239,376 | B1 * | 5/2001 | Kimura | H01L 24/85 |
|  |  |  |  | 174/36 |
| 6,608,390 | B2 * | 8/2003 | Beatson | H01L 23/13 |
|  |  |  |  | 257/784 |
| 6,894,398 | B2 * | 5/2005 | Pon | H01L 24/49 |
|  |  |  |  | 257/784 |
| 7,084,656 | B1 * | 8/2006 | Khandros | H01L 24/14 |
|  |  |  |  | 324/755.05 |
| 7,179,688 | B2 * | 2/2007 | Batish | H01L 23/49558 |
|  |  |  |  | 257/E23.033 |
| 7,202,109 | B1 * | 4/2007 | Zakharian | H01L 21/6835 |
|  |  |  |  | 257/E23.033 |
| 7,374,969 | B2 * | 5/2008 | Cho | H01L 24/85 |
|  |  |  |  | 257/788 |
| 7,932,131 | B2 * | 4/2011 | Foong | H01L 24/27 |
|  |  |  |  | 257/784 |
| 8,536,717 | B2 * | 9/2013 | Low | H01L 24/48 |
|  |  |  |  | 257/784 |
| 9,343,388 | B2 * | 5/2016 | Terai | H01L 24/73 |
| 9,355,950 | B1 * | 5/2016 | Bayerer | H01L 23/4985 |
| 10,593,605 | B2 * | 3/2020 | Otsubo | H01L 23/053 |
| 11,056,457 | B2 * | 7/2021 | Low | H01L 21/565 |
| 2002/0060356 | A1 * | 5/2002 | Nishibori | H01L 23/3735 |
|  |  |  |  | 257/737 |
| 2002/0062973 | A1 * | 5/2002 | Yamada | H01L 25/072 |
|  |  |  |  | 257/E23.14 |
| 2002/0089069 | A1 * | 7/2002 | Lamson | H01L 23/642 |
|  |  |  |  | 257/784 |
| 2002/0113302 | A1 * | 8/2002 | Shinohara | H01L 23/49575 |
|  |  |  |  | 257/E23.092 |
| 2002/0140112 | A1 * | 10/2002 | Pon | H01L 24/43 |
|  |  |  |  | 257/784 |
| 2003/0090001 | A1 * | 5/2003 | Beatson | H01L 24/85 |
|  |  |  |  | 257/E23.125 |
| 2004/0065468 | A1 * | 4/2004 | Seuntjens | H01L 24/45 |
|  |  |  |  | 174/94 R |
| 2004/0178498 | A1 * | 9/2004 | Low | H01L 24/49 |
|  |  |  |  | 257/E23.079 |
| 2005/0093112 | A1 * | 5/2005 | Kim | H01L 24/45 |
|  |  |  |  | 257/E23.056 |
| 2006/0175712 | A1 * | 8/2006 | Lyn | H01L 24/49 |
|  |  |  |  | 257/691 |
| 2007/0262426 | A1 * | 11/2007 | Mahler | C08G 18/72 |
|  |  |  |  | 257/E23.056 |
| 2007/0284719 | A1 * | 12/2007 | Shiota | H01L 25/072 |
|  |  |  |  | 257/E23.025 |
| 2008/0007918 | A1 | 1/2008 | Lederer et al. | |
| 2008/0029845 | A1 * | 2/2008 | Shen | H01L 23/645 |
|  |  |  |  | 257/E21.022 |
| 2008/0296780 | A1 * | 12/2008 | Yoo | H01L 24/48 |
|  |  |  |  | 257/E23.025 |
| 2009/0102067 | A1 * | 4/2009 | Wyland | H01L 24/48 |
|  |  |  |  | 257/784 |
| 2010/0230828 | A1 * | 9/2010 | Haba | H01L 23/3121 |
|  |  |  |  | 257/784 |
| 2010/0308457 | A1 * | 12/2010 | Ishii | H01L 24/49 |
|  |  |  |  | 257/784 |
| 2011/0298121 | A1 * | 12/2011 | Nishibori | H01L 25/072 |
|  |  |  |  | 257/784 |
| 2013/0181228 | A1 * | 7/2013 | Usui | H01L 23/4334 |
|  |  |  |  | 257/E21.705 |
| 2014/0035123 | A1 * | 2/2014 | Oka | H01L 23/49811 |
|  |  |  |  | 438/122 |
| 2016/0005671 | A1 * | 1/2016 | Tsuyuno | H01L 23/24 |
|  |  |  |  | 257/789 |
| 2016/0086870 | A1 * | 3/2016 | Abe | H01L 24/49 |
|  |  |  |  | 257/712 |
| 2016/0093783 | A1 * | 3/2016 | Singer | H10H 20/8506 |
|  |  |  |  | 438/27 |
| 2016/0126208 | A1 * | 5/2016 | Lee | H01L 24/85 |
|  |  |  |  | 228/180.5 |
| 2016/0141214 | A1 * | 5/2016 | Sato | H01L 23/49811 |
|  |  |  |  | 257/77 |
| 2016/0293563 | A1 * | 10/2016 | Fujino | H01L 23/24 |
| 2016/0372402 | A1 * | 12/2016 | Cahill | H01L 23/4952 |
| 2016/0372440 | A1 * | 12/2016 | Cahill | H01L 24/49 |
| 2017/0064808 | A1 * | 3/2017 | Rizza | H01L 25/18 |
| 2017/0084521 | A1 * | 3/2017 | Chang | H01L 23/3114 |
| 2017/0207146 | A1 * | 7/2017 | Ouyang | H01L 24/49 |
| 2017/0278771 | A1 * | 9/2017 | Kanai | H01L 23/3121 |
| 2018/0005923 | A1 * | 1/2018 | Shimizu | H01L 23/053 |
| 2018/0026004 | A1 * | 1/2018 | Han | H01L 25/0657 |
|  |  |  |  | 257/737 |
| 2018/0098437 | A1 * | 4/2018 | Gray Haley | H05K 3/328 |
| 2018/0166414 | A1 * | 6/2018 | Tsai | H01L 25/0657 |
| 2018/0301421 | A1 * | 10/2018 | Yamashita | H01L 21/52 |
| 2019/0295991 | A1 | 9/2019 | Takahashi | |
| 2019/0385969 | A1 * | 12/2019 | Gray Haley | H01L 24/16 |
| 2020/0020622 | A1 * | 1/2020 | Kaji | H01L 23/04 |
| 2020/0083146 | A1 * | 3/2020 | Ishibashi | H01L 24/83 |
| 2020/0091118 | A1 | 3/2020 | Matsuyama | |
| 2020/0168576 | A1 * | 5/2020 | Choi | H01L 23/49524 |
| 2020/0243490 | A1 | 7/2020 | Matsuyama | |
| 2020/0395255 | A1 * | 12/2020 | Kaneda | H01L 23/36 |
| 2021/0217724 | A1 * | 7/2021 | Matsui | H01L 23/3735 |
| 2021/0296190 | A1 * | 9/2021 | Nakamata | H01L 23/3735 |
| 2021/0305107 | A1 * | 9/2021 | Miyata | H01L 23/3121 |
| 2021/0313253 | A1 * | 10/2021 | Ogawa | H01L 23/49816 |
| 2021/0391299 | A1 * | 12/2021 | Kaji | H01L 23/24 |
| 2022/0051961 | A1 * | 2/2022 | Ogawa | H01L 22/12 |
| 2022/0208698 | A1 * | 6/2022 | Ting | H01L 23/535 |
| 2022/0302075 | A1 * | 9/2022 | Masuda | H01L 23/049 |
| 2023/0024580 | A1 * | 1/2023 | Sakamoto | H01L 24/83 |
| 2023/0140664 | A1 * | 5/2023 | Kaji | H01L 25/072 |
|  |  |  |  | 257/85 |

FOREIGN PATENT DOCUMENTS

| EP |  | 4084062 | A1 * | 11/2022 | H01L 25/072 |
|---|---|---|---|---|---|
| JP |  | H04116838 | A * | 4/1992 | H01L 24/78 |
| JP |  | H05152367 | A * | 6/1993 | H01L 24/45 |

(56)         References Cited

FOREIGN PATENT DOCUMENTS

| | | | | | | |
|----|----------------|----|---|--------|-------------|-------------|
| JP | H05251491 | A | * | 9/1993 | ............. | H01L 24/78 |
| JP | 2007-335858 | A | | 12/2007 | | |
| JP | 2009105266 | A | * | 5/2009 | ............. | H01L 24/91 |
| JP | 2015-133368 | A | | 7/2015 | | |
| JP | 2015-213408 | A | | 11/2015 | | |
| JP | 2019-169493 | A | | 10/2019 | | |
| JP | 2020-047677 | A | | 3/2020 | | |
| KR | 20110132522 | A | * | 12/2011 | ............. | H01L 23/36 |
| KR | 20160022121 | A | * | 2/2016 | ......... | H01L 25/0652 |
| WO | WO-2022168410 | A1 | * | 8/2002 | ........... | H01L 25/072 |

OTHER PUBLICATIONS

An Office Action mailed by the German Patent Office on Nov. 24, 2025, which corresponds to German Patent Application No. 10 2023 118 673.6 and is related to U.S. Appl. No. 18/323,985.

* cited by examiner

F I G. 3
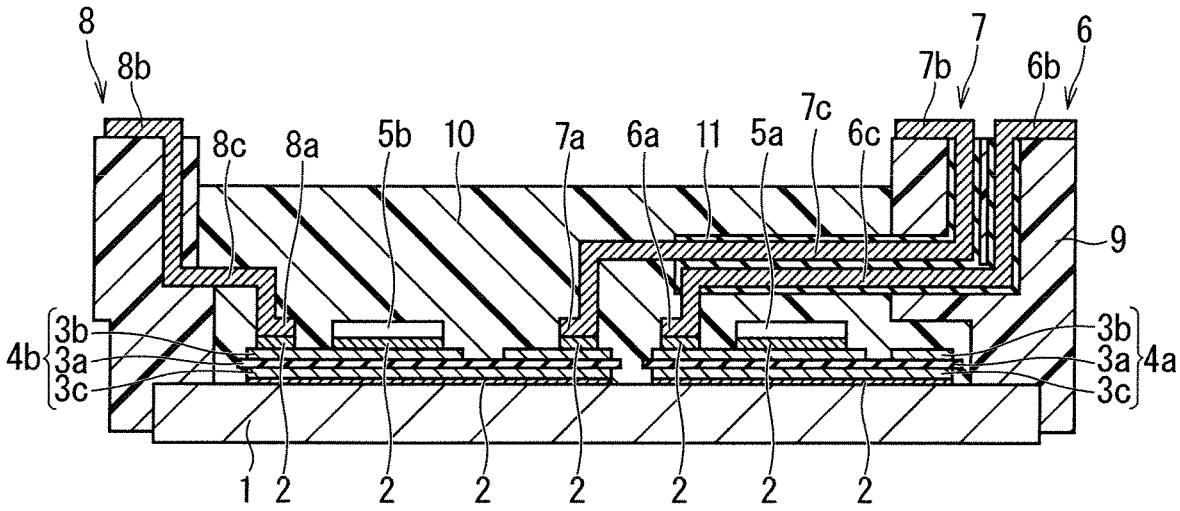
F I G. 4
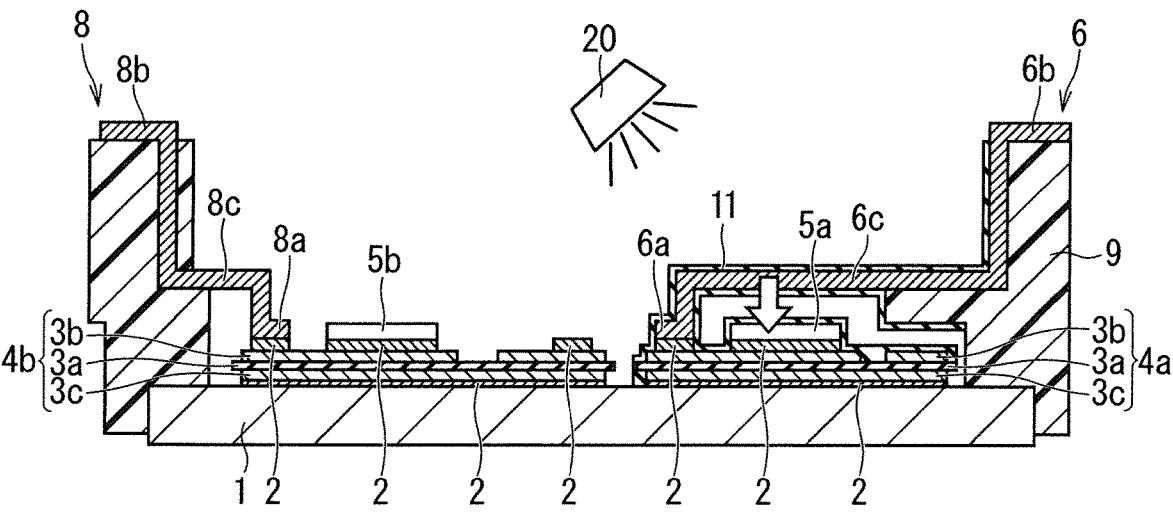

SEMICONDUCTOR DEVICE COMPRISING ELECTRODE TERMINALS COATED WITH AN INSULATING FILM HAVING A THICKNESS OF LESS THAN 100 MICRONS, METHOD OF MANUFACTURING THE SEMICONDUCTOR DEVICE, AND POWER CONVERSION APPARATUS COMPRISING THE SEMICONDUCTOR DEVICE

BACKGROUND OF THE INVENTION

Field of the Invention

The present disclosure relates to a semiconductor device, a method of manufacturing the semiconductor device, and a power conversion apparatus.

Description of the Background Art

A structure described in Japanese Patent Application Laid-Open No. 2015-213408 has been proposed as a structure that reduces the inductance inside a semiconductor device.

In the semiconductor power module, which corresponds to a semiconductor device, disclosed in Japanese Patent Application Laid-Open. No. 2015-213408, a positive terminal and a negative terminal are arranged in parallel, and the same current flows therethrough in the opposite directions. As a result, in a space between each terminal, the magnetic fields generated by the current cancel each other out, reducing the inductance of the current path. The space is secured by interposing an insulating resin, insulating paper, or laminate coating between the terminals.

SUMMARY

However, in the semiconductor power module described in Japanese Patent Application Laid-Open No. 2015-213408, the insulating resin, insulating paper, or laminate coating is interposed between each terminal for insulation, which requires a certain thickness as an insulating member. Because of this reason, there has been a problem that the self-inductance of the semiconductor power module increases.

An object of the present disclosure is to provide a technique that lowers the self-inductance of a semiconductor device.

According to the present disclosure, a semiconductor device includes an insulating substrate, a semiconductor element, and a plurality of electrode terminals. An insulating substrate has a circuit pattern formed on an upper surface thereof. The semiconductor elements are mounted on the upper surface of the circuit pattern. A plurality of electrode terminals each have the one end portion bonded to the upper surface of the circuit pattern. The electrode terminals 6, 7 having portions of mutual adjacency of the plurality of electrode terminals 6, 7, 8 are coated with an insulating film having a thickness of less than 100 μm, at least at the portions.

The insulating film thinner than an insulating resin, insulating paper, and a laminate coating is interposed between the adjacent electrode terminals, thereby reducing the self-inductance of the semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a cross-sectional view of a semiconductor device according to Embodiment 2;

FIG. 4 is a cross-sectional view for explanation for a method of manufacturing a semiconductor device according to Embodiment 3;

DESCRIPTION OF THE PREFERRED EMBODIMENTS

Embodiment 1

<Overall Configuration>

Figure 1:
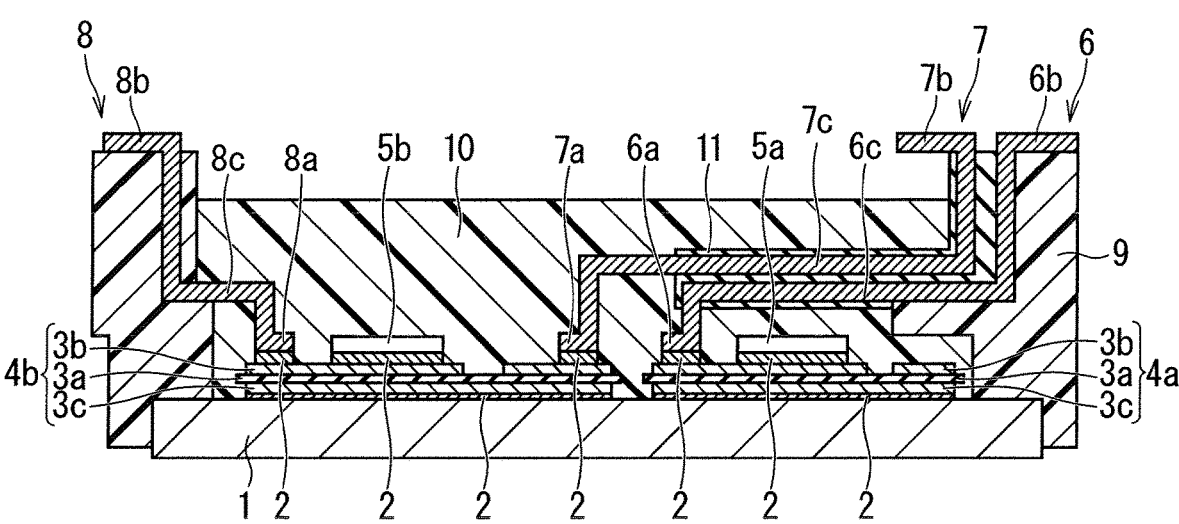
FIG. 1 is a cross-sectional view of a semiconductor device according to Embodiment 1.

Embodiment 1 will be described below with reference to the drawings. FIG. 1 is a cross-sectional view of a semiconductor device according to Embodiment 1.

As illustrated in FIG. 1, the semiconductor device includes a base plate 1, insulating substrates 4a, 4b, semiconductor elements 5a, 5b, electrode terminals 6, 7, 8, a case 9, and a sealing material 10.

The base plate 1 is composed primarily of copper as the main material thereof. Also, the base plate 1 is formed in a rectangular shape in top view.

The insulating substrates 4a, 4b are bonded to the upper surface of the base plate 1 through solder 2 on the inner peripheral side of the peripheral portion. In FIG. 1, the insulating substrate 4a being the high potential side is arranged on the right side, and the insulating substrate 4b being the low potential side is arranged on the left side. Each of the insulating substrates 4a, 4b includes an insulating layer 3a, a circuit pattern 3b, and a circuit pattern 3c. The insulating layer 3a is composed primarily of ceramic as the main material thereof, for example. The insulating layer 3a is provided with a plurality of conductive circuit patterns 3b on the upper surface thereof. The insulating layer 3a is also provided with a conductive circuit pattern 3c on the lower surface thereof. The circuit patterns 3b, 3c are composed primarily of copper as the main material thereof, for example.

The semiconductor element 5a is mounted on the upper surface of the circuit pattern 3b of the insulating substrate 4a through the solder 2. And the semiconductor element 5b is mounted on the upper surface of the circuit pattern 3b of the insulating substrate 4b through the solder 2. The semiconductor elements 5a, 5b, which are composed of silicon, are such as an Insulated Gate Bipolar Transistor (IGBT). Here, the semiconductor element 5a corresponds to a first semiconductor element, and the semiconductor element 5b corresponds to a second semiconductor element.

Although two semiconductor elements 5a, 5b are mounted in FIG. 1, the number of semiconductor elements 5a, 5b is not limited to two. In terms of the number of semiconductor elements 5a, 5b, the same applies to the following Embodiments.

The case 9, which is to have four sides, is formed in a rectangular frame shape in top view. The case 9 is fixed to the peripheral portion of the base plate 1 through, for example, an unillustrated adhesive, and surrounds the insulating substrates 4a, 4b and the semiconductor elements 5a, 5b.

An electrode terminal 6 is configured with one end portion 6a bonded to the upper surface of the circuit pattern 3b of the insulating substrate 4a, an other end portion 6b fixed to a first side of the case 9, and a middle portion 6c between the one end portion 6a and the other end portion 6b. An electrode terminal 7 is configured with one end portion 7a bonded to the upper surface of the circuit pattern 3b of the insulating substrate 4b, an other end portion 7b fixed to the first side of the case 9, and a middle portion 7c between the one end portion 7a and the other end portion 7b. An electrode terminal 8 is configured with one end portion 8a bonded to the upper surface of the circuit pattern 3b of the insulating substrate 4b, an other end portion 8b fixed to a second side of the case 9, and a middle portion 8c between the one end portion 8a and the other end portion 8b.

Here, the electrode terminal 6 corresponds to a first electrode terminal, and the electrode terminal 7 corresponds to a second electrode terminal. Also, the second side of the case 9 is a side that is opposite to the first side.

The one end portion 6a of the electrode terminal 6 is bonded to the upper surface of the circuit pattern 3b of the insulating substrate 4a through the solder 2, and the other end portion 6b of the electrode terminal 6 is fixed to the first side of the case 9 with an unillustrated adhesive. The one end portion 7a of the electrode terminal 7 is bonded to the upper surface of the circuit pattern 3b of the insulating substrate 4b through the solder 2, and the other end portion 7b of the electrode terminal 7 is fixed to the first side of the case 9 through an insulating film 11.

The one end portion of the electrode terminal 8 is bonded to the upper surface of the circuit pattern 3b of the insulating substrate 4b through the solder 2, and the other end portion 8b of the electrode terminal 8 is fixed to the second side of the case 9.

The sealing material 10 is filled inside the case 9 and covers the insulating substrates 4a, 4b and the semiconductor elements 5a, 5b. The sealing material 10 is composed of silicone gel, for example.

Figure 2:
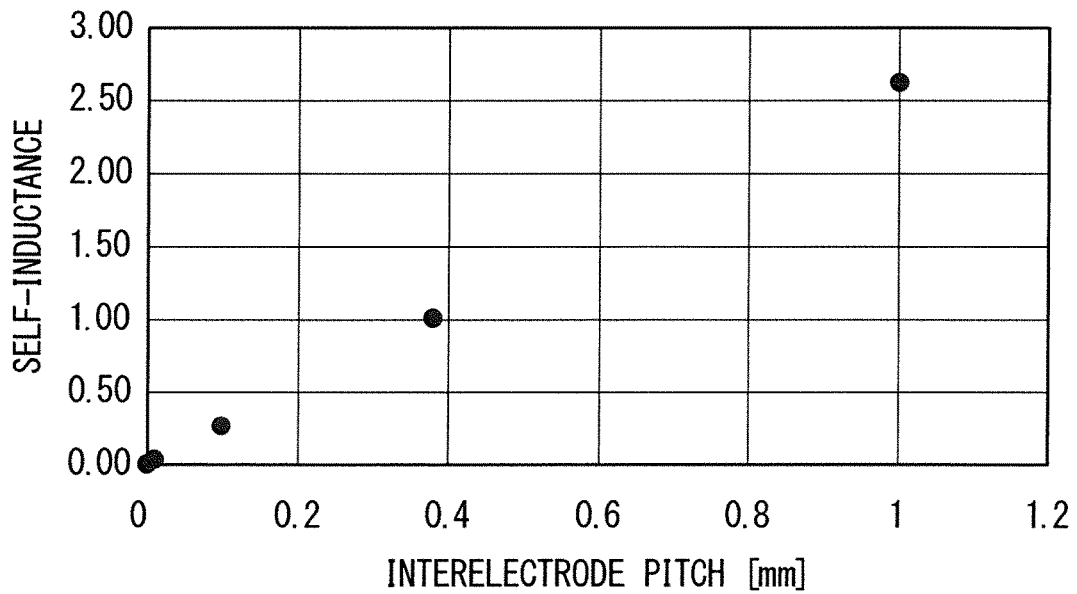
FIG. 2 is a graph illustrating the relationship between the interelectrode pitch and self-inductance.

Next, features of the semiconductor device according to Embodiment 1 will be described with reference to FIG. 1 and FIG. 2. FIG. 2 is a graph illustrating the relationship between the interelectrode pitch and self-inductance.

As illustrated in FIG. 1, the electrode terminals 6, 7 are arranged in parallel to reduce self-inductance and have portions of mutual adjacency. The electrode terminals 6, 7 are coated with the insulating film 11 having a thickness of less than 100 μm, at least at the portions of mutual adjacency. As illustrated in FIG. 2, the thickness of the insulating member, which is the interelectrode pitch, and the magnitude of self-inductance are typically proportional. In Embodiment 1, the distance between the electrode terminals 6, 7 is set to less than 100 μm, thereby materializing a low inductance structure for the semiconductor device with the insulation distance between the electrode terminals 6, 7 maintained.

Here, the portions of mutual adjacency of the electrode terminals 6, 7 represent portions from the portions located on the inner peripheral side of the case 9 of the other end portions 6b, 7b to the portions of the middle portions 6c, 7c in the electrode terminals 6, 7.

<Effect>

As described above, the semiconductor device according to Embodiment 1 includes the insulating substrates 4a, 4b having circuit patterns 3b formed on the upper surfaces thereof, the semiconductor elements 5a, 5b mounted on the upper surface of the circuit patterns 3b, and a plurality of electrode terminals 6, 7, 8 each having the one end portion bonded to the upper surface of the circuit pattern 3b. The electrode terminals 6, 7 having portions of mutual adjacency of the plurality of electrode terminals 6, 7, 8 are coated with the insulating film 11 having a thickness of less than 100 μm, at least at the portions.

Accordingly, the insulating film 11 thinner than the insulating resin, the insulating paper, and the laminate coating is interposed between the adjacent electrode terminals 6, 7, thereby reducing the self-inductance of the semiconductor device.

Embodiment 2

Next, a semiconductor device according to Embodiment 2 will be described. FIG. 3 is a cross-sectional view of the semiconductor device according to Embodiment 2. In Embodiment 2, the same components as those described in Embodiment 1 are denoted by the same reference numerals, and the description thereof is omitted.

As illustrated in FIG. 3, in Embodiment 2, the other end portions 6b, 7b, 8b of the electrode terminals 6, 7, 8 are insert-molded in the case 9. Specifically, the other end portion 6b of the electrode terminal 6 is formed integrally with the first side of the case 9. Similarly, the other end portion 7b of the electrode terminal 7 is formed integrally with the first side of the case 9. Further, the other end portion 8b of the electrode terminal 8 is formed integrally with the second side of the case 9.

The insulating film 11 is coated on the portions of mutual adjacency of the electrode terminals 6, 7. At this point, if the portions have already been coated, one of the electrode terminals 6, 7 may only be coated. The portions of the electrode terminals 6, 7 that are formed integrally with the case 9 do not necessarily need to be coated as long as the insulation distance is secured.

As described above, the semiconductor device according to Embodiment 2 further includes the base plate 1 bonded to the lower surfaces of insulating substrates 4a, 4b, and the case 9 fixed to the periphery portion of the base plate 1, in which the other end portions of the plurality of electrode terminals 6, 7, 8 are formed integrally with the case 9.

Accordingly, the electrode terminals 6, 7 are securely held in the case 9, allowing for a narrower pitch between the electrode terminals 6, 7 and shorter terminal lengths for the electrode terminals 6, 7, 8. This contributes to miniaturization of the semiconductor device.

Embodiment 3

Figure 5:
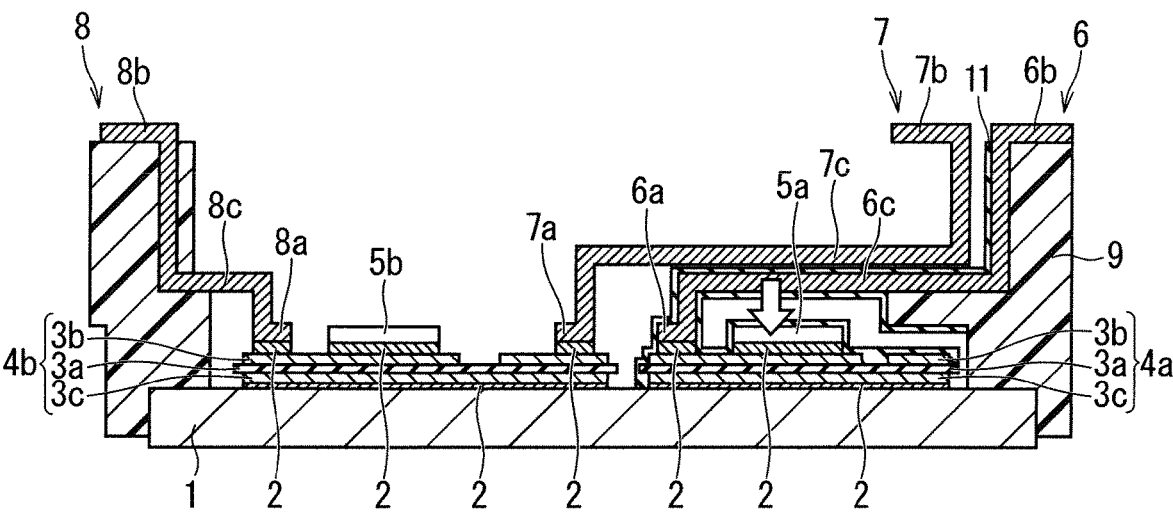
FIG. 5 is a cross-sectional view for explanation for the method of manufacturing the semiconductor device according to Embodiment 3.
Figure 6:
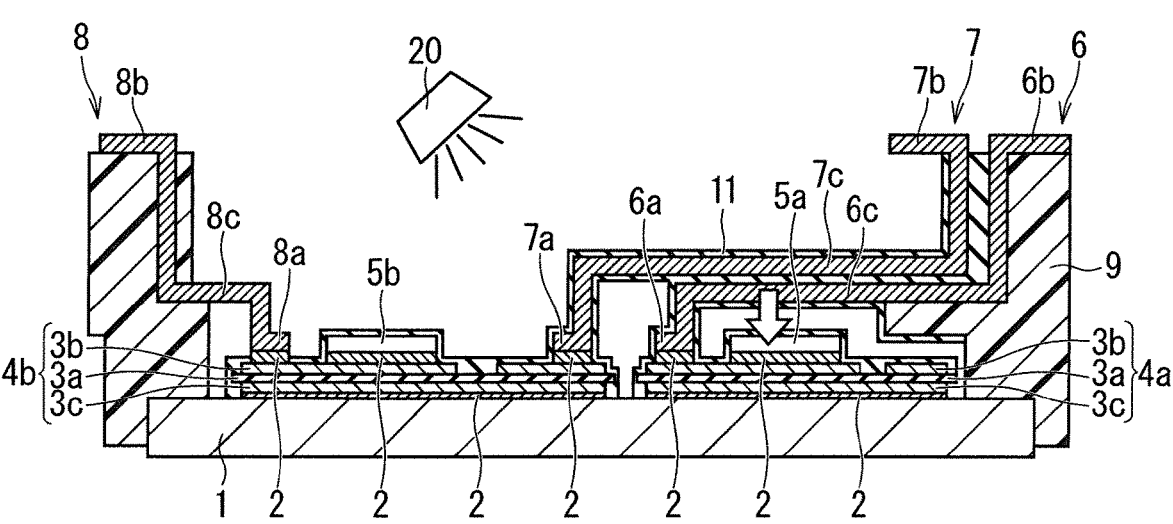
FIG. 6 is a cross-sectional view for explanation for the method of manufacturing the semiconductor device according to Embodiment 3.

Next, a semiconductor device according to Embodiment 3 will be described. FIGS. 4 to 6 are cross-sectional views for explanation for a method of manufacturing the semiconductor device according to Embodiment 3. It should be noted that, in Embodiment 3, the same components as those described in Embodiments 1 and 2 are denoted by the same reference numerals, and the description thereof is omitted.

In Embodiment 3, the material of the insulating film 11 is changed with respect to that of Embodiment 1. The insulating film 11 is composed of an insulating coating material with excellent heat resistance and bonds the electrode terminals 6, 7, which have the portions of mutual adjacency, and the sealing material 10 via noncovalent bonding. This improves the adhesion between the electrode terminals 6, 7 and the sealing material 10. The insulating coating material is, for example, a highly heat-resistant coating material "HIMAL" manufactured by Showa Denko Materials Co., Ltd.

The semiconductor elements 5a, 5b are switching elements, and when a large current flows through the electrode terminals 6, 7, the electrode terminals 6, 7 self-heat as well.

In addition, each member that constitutes a semiconductor device typically has the characteristic of expanding and contracting with changes in temperature, and the degree of expansion and contraction varies depending on the material of each member. Due to the heat generated by the electrode terminals 6, 7 and the semiconductor elements 5a, 5b, each member undergoes repeated cycles of expansion and contraction, posing a concern about potential peeling occurring between the electrode terminals 6, 7 and the sealing material 10.

Meanwhile, the semiconductor device according to Embodiment 3 includes the base plate 1 bonded to the lower surfaces of the insulating substrates 4a, 4b, and the case 9 fixed to the peripheral portion of the base plate 1, and the sealing material 10 for sealing the inside of the case 9, in which the insulating film 11 is composed of an insulating coating material that bonds the electrode terminals 6, 7 having the portions of mutual adjacency of the plurality of electrode terminals 6, 7, 8 and the sealing material 10 through noncovalent bonding.

This improves the adhesion between the electrode terminals 6, 7 and the sealing material 10, enabling to suppress the occurrence of peeling between the electrode terminals 6, 7 and the sealing material 10. This contributes to high reliability of the semiconductor device.

Here, the insulating film 11 not only coats the portions of mutual adjacency of the electrode terminals 6, 7, but also covers the semiconductor elements 5a, Sb and the one end portions 6a, 7a of the electrode terminals 6, 7. A manufacturing method in this case will be described below.

First, although not illustrated, the insulating substrates 4a, 4b are bonded to the upper surface of the base plate 1, excluding the peripheral portions, through the solder 2, and the case 9 is fixed through unillustrated adhesive at the peripheral portion in the upper surface of the base plate 1. Next, one end portion 8a of the electrode terminal 8 integrally formed with the case 9 is bonded to the upper surface of the circuit pattern 3b of the insulating substrate 4b through the solder 2.

Next, as illustrated in FIG. 4, one end portion 6a of the electrode terminal 6 is bonded, through the solder 2, to the upper surface of a first portion on which the semiconductor element 5a among the circuit patterns 3b is mounted, and the other end portion 6b is bonded to the case 9 through an unillustrated adhesive. Here, the first portion refers to the circuit pattern 3b of the insulating substrate 4a. Next, an insulating coating material to be the insulating film 11 is applied to the electrode terminal 6 by a spray 20. At this point, the insulating coating material is also applied to the circuit pattern 3b of the insulating substrate 4a and the semiconductor element 5a. Next, as illustrated in FIG. 5, one end portion 7a of the electrode terminal 7 is bonded, through the solder 2, to the upper surface of a second portion among the circuit patterns 3b on which the semiconductor element 5b is mounted so as to have the adjacent portion to the electrode terminal 6, and the other end portion 7b is bonded to the case 9. The other end portion 7b is bonded to the case 9 through the insulating coating material applied to the electrode terminal 6. Here, the second portion refers to the circuit pattern 3b of the insulating substrate 4a.

Next, the insulating coating material to be the insulating film 11 is applied to the inner portion of the case 9 by a spray 20. Specifically, the insulating coating material is also applied to the electrode terminal 7, the circuit pattern 3b of the insulating substrate 4b and the semiconductor element 5b. Through the steps described above, the upper surfaces of the circuit patterns 3b of the insulating substrates 4a, 4b, the semiconductor elements 5a, 5b, and the electrode terminals 6, 7 are coated with the insulating film 11, Next, the inside of the case 9 is filled with the sealing material 10 (see FIG. 1) to complete the semiconductor device.

As described above, in the semiconductor device according to Embodiment 3, the insulating film 11 covers the semiconductor elements 5a, 5b and the one end portions 6a, 7a of the electrode terminals 6, 7 having the portions of mutual adjacency of the plurality of electrode terminals 6, 7, 8.

Also, the method of manufacturing the semiconductor device according to Embodiment 3, including a step (a) of applying the insulating coating material to the electrode terminal 6 in which the one end portion 6a is bonded to the upper surface of the first portion on which the semiconductor element 5a is mounted among the circuit patterns 3b, and the first portion among the circuit patterns 3b, a step (b) of bonding the one end portion 7a of the electrode terminal 7 to the upper surface of the second portion on which the semiconductor element 5b is mounted among the circuit patterns 3b, and bonding the other end portion 7b to the case 9, and a step of (c) of applying the insulating coating material to the electrode terminal 7 and the second portion of the circuit patterns 3b.

Therefore, the adhesion between the semiconductor elements 5a, 5b and the sealing material 10, and between the one end portions 6a, 7a of the electrode terminals 6, 7 and the sealing material 10 improves, further contributing to improvement in reliability of the semiconductor device.

Modification of Embodiments 1 to 3

The semiconductor elements 5a, 5b may be composed of a wide bandgap semiconductor containing silicon carbide or gallium nitride. Wide bandgap semiconductors are used at high temperatures, which have a tendency to generate oscillations more easily than silicon. In Embodiments 1 to 3, the self-inductance of the semiconductor device can be reduced, exhibiting the effect of suppressing oscillation.

Figure 7:
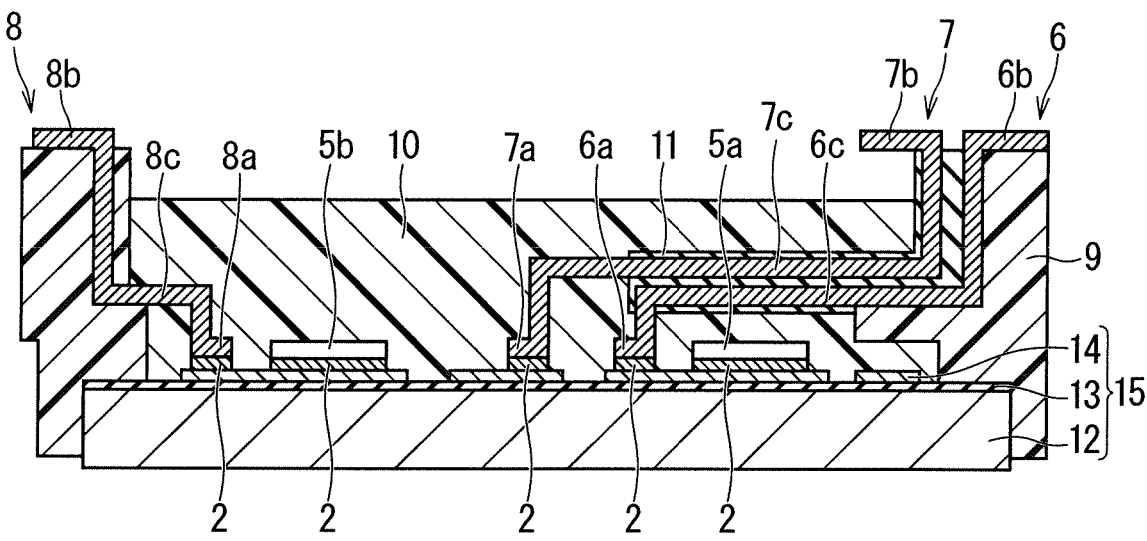
FIG. 7 is a cross-sectional view of a semiconductor device according to Modification of Embodiment 1.

Further, in Embodiments 1 to 3, instead of the insulating substrates 4a, 4b, an insulating substrate in which a base plate and a circuit pattern are integrally molded through a resin insulating layer may be adopted. Next, such a configuration will be described by taking Modification of Embodiment 1 as an example. FIG. 7 is a cross-sectional view of a semiconductor device according to Modification of Embodiment 1.

As illustrated in FIG. 7, the semiconductor device includes an insulating substrate 15, the semiconductor elements 5*a*, 5*b*, the electrode terminals 6, 7, 8, the case 9, and the sealing material 10. Here, only the configuration of the insulating substrate 15 will be described.

The insulating substrate 15 includes a base plate 12, a resin insulating layer 13 formed on the upper surface of the base plate 12, and a circuit pattern 14 formed on the upper surface of resin insulating layer 13, and is integrally molded. The base plate 12 is composed primarily of metal materials such as copper, iron, and aluminum as the main material thereof. The resin insulation layer 13 is composed of an epoxy resin as the main material thereof, for example. The circuit patterns 14 are composed primarily of copper as the main material thereof, for example.

Embodiment 4

In Embodiment 4, a semiconductor device according to above-described Embodiments 1 to 3 is applied to a power conversion apparatus. Although the application of the semiconductor device according to Embodiments 1 to 3 is not limited to a specific power conversion apparatus, hereinafter, as Embodiment 4, a case where the semiconductor device according to Embodiments 1 to 3 is applied to a three-phase inverter will be described.

Figure 8:
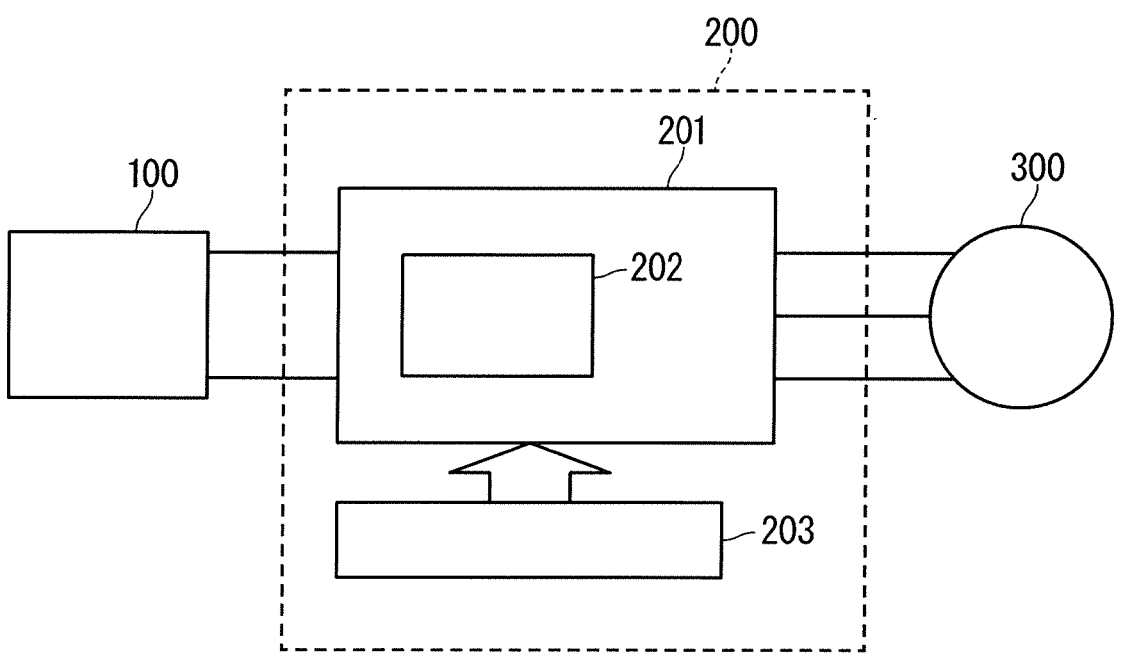
FIG. 8 is a block diagram illustrating a configuration a power conversion system to which a power conversion apparatus according to Embodiment 4 is applied.

FIG. 8 is a block diagram illustrating a configuration of a power conversion system to which a power conversion apparatus of the Embodiment 4 is applied.

The power conversion system illustrated in FIG. 8 includes a power supply 100, a power conversion apparatus 200, and a load 300. The power supply 100 is a DC power supply and supplies DC power to the power conversion apparatus 200. The power supply 100 can be configured with various components, for example, the configuration thereof may include a DC system, a solar cell, and a storage battery, or include a rectifier circuit connected to an AC system or an AC/DC converter. Further, the power supply 100 may be configured by a DC/DC converter that converts the DC power output from the DC system into a predetermined power.

The power conversion apparatus 200 is a three-phase inverter connected between the power supply 100 and the load 300, which converts the DC power supplied from the power supply 100 into AC power and supplies the AC power to the load 300. As illustrated in FIG. 8, the power conversion apparatus 200 includes a main conversion circuit 201 that converts DC power into AC power and outputs thereof, and a control circuit 203 that outputs a control signal for controlling the main conversion circuit 201 to the main conversion circuit 201.

The load 300 is a three-phase electric motor driven by AC power supplied from the power conversion apparatus 200. The load 300 is not limited to a specific application, and is an electric motor mounted on various electric devices. For example, the load 300 is used as an electric motor for a hybrid vehicle, an electric vehicle, a railroad vehicle, an elevator, or an air conditioning apparatus.

Hereinafter, the detailed description is made on the power conversion apparatus 200. The main conversion circuit 201 includes a switching element (not illustrated) and a freewheeling diode (not illustrated), and by switching the switching element, the DC power supplied from the power supply 100 is converted into AC power and supplied to the load 300. There are various specific circuit configurations of the main conversion circuit 201, and the main conversion circuit 201 according to Embodiment 4 is a two-level three-phase full bridge circuit, and includes six switching elements and six freewheeling diodes each of which is anti-parallel with the respective switching elements. At least one of each switching element and each freewheeling diode of the main conversion circuit 201 is configured by a semiconductor module 202 corresponding to any one of above-described Embodiments 1 to 3. Each of the two switching elements connected in series of the six switching elements constitutes an upper and lower arm, and each set of upper and lower arms constitutes each phase (U phase, V phase, W phase) of the full bridge circuit. Then, the output terminal of each set of upper and lower arms, that is, the three output terminals of the main conversion circuit 201, are connected to the load 300.

Further, the main conversion circuit 201 includes a drive circuit (not illustrated) for driving each switching element, and the drive circuit may be built in the semiconductor module 202, or adopt a configuration in which the drive circuit is provided separately from the semiconductor module 202. The drive circuit generates drive signals for driving the switching element of the main conversion circuit 201 and supplies the drive signals to the control electrode of the switching elements of the main conversion circuit 201. Specifically, in response to a control signal from the control circuit 203 described later, a drive signal for turning on the switching element and a drive signal for turning off the switching element are output to the control electrode of each switching element. When the switching element is kept in the ON state, the drive signal is a voltage signal (ON signal) equal to or higher than a threshold voltage of the switching element, and when the switching element is kept in the OFF state, the drive signal is a voltage signal (OFF signal) equal to or lower than the threshold voltage of the switching element.

The control circuit 203 controls the switching elements of the main conversion circuit 201 so that the desired power is supplied to the load 300. Specifically, the time (ON time) for each switching element of the main conversion circuit 201 to be in the ON state is calculated based on the power to be supplied to the load 300. For example, the main conversion circuit 201 is controlled by PWM control that modulates the ON time of the switching elements in response to the voltage to be output. Then, a control command (control signal) is output to the drive circuit provided in the main conversion circuit 201 so that an ON signal is output to the switching element supposed to be turned on and an OFF signal is output to the switching element supposed to be turned off at each time point. The drive circuit outputs an ON signal or an OFF signal as a drive signal to the control electrode of each switching element in response to the control signal.

In the power conversion apparatus according to Embodiment 4, the semiconductor modules according to Embodiments 1 to 4 are applied as the switching elements and the free wheel diodes of the main converter circuit 201, improving reliability.

Although in Embodiment 4, the example of the semiconductor devices according to Embodiments 1 to 3 being applied to the two-level three-phase inverter has been described, the semiconductor devices according to Embodiments 1 to 3 are not limited thereto and can be applied to various power conversion apparatuses. Although in Embodiment 4, a two-level power conversion apparatus is adopted, a three-level or multi-level power conversion apparatus may also be adoptable, and when power is supplied to a single-phase load, the semiconductor devices according to Embodiments 1 to 3 may also be adopted to a single-phase inverter. Further, when supplying power to a DC load or the like, the semiconductor devices according to Embodiments 1 to 3 are adoptable to the DC/DC converter or the AC/DC converter.

Further, the power conversion apparatus to which any one of the semiconductor devices according to Embodiments 1 to 3 is applied is not limited to the case where the above-mentioned load is an electric motor, the power conversion apparatus is applicable to the case where a load is a power supply device for an electric discharge machine, a laser machine, an induction heating cooker, or a contactless power supply system, and even further applicable to the case where a load is a power conditioner for a solar power generation system and a power storage systems, for example.

The Embodiments can be arbitrarily combined, appropriately modified or omitted.

Hereinafter, various aspects of the present disclosure will be collectively described as Appendices.

(Appendix 1)

A semiconductor device including an insulating substrate having a circuit pattern formed on an upper surface thereof, a semiconductor element mounted on the upper surface of the circuit pattern, and a plurality of electrode terminals each having one end portion bonded to the upper surface of the circuit pattern, in which, the electrode terminals having portions of mutual adjacency of the plurality of electrode terminals are coated with the insulating film having a thickness of less than 100 μm, at least at the portions.

(Appendix 2)

The semiconductor device according to Appendix 1, further including a base plate bonded to a lower surface of the insulating substrate, and a case fixed to a periphery portion of the base plate, in which other end portions of the plurality of electrode terminals are formed integrally with the case.

(Appendix 3)

The semiconductor device according to Appendix 1, further including a base plate bonded to a lower surface of the insulating substrate, a case fixed to a periphery portion of the base plate, and a sealing material that seals inside of the case, in which the insulating film is composed of an insulating coating material that bonds, the electrode terminals having the portions of mutual adjacency of the plurality of electrode terminals and the sealing material through non-covalent bonding.

(Appendix 4)

The semiconductor device according to Appendix 3, in which the insulating film covers the semiconductor element and one end portions of the electrode terminals having the portions of mutual adjacency of the plurality of electrode terminals.

(Appendix 5)

The semiconductor device according to Appendix 1, in which the insulating substrate includes a base plate, a resin insulating layer formed on an upper surface of the base plate, and the circuit pattern formed on an upper surface of the resin insulating layer, and is integrally molded.

(Appendix 6)

The semiconductor device according to any one of Appendices 1 to 5, in which the semiconductor element is composed of a wide band-gap semiconductor containing silicon carbide or gallium nitride.

(Appendix 7)

A method of manufacturing the semiconductor device according to Appendix 4, in which the plurality of electrode terminals includes a first electrode terminal having the portions of mutual adjacency and a second electrode terminal, and the semiconductor element includes a first semiconductor element and a second semiconductor element, the method including (a) applying the insulating coting material to the first electrode terminal in which one end portion is bonded on an upper surface of a first portion on which the first semiconductor element is mounted in the circuit pattern and an other end portion is bonded to the case, and the first portion of the circuit pattern, (b) bonding one end portion of the second electrode terminal to an upper surface of a second portion on which the second semiconductor element is mounted in the circuit pattern, and bonding an other end portion to the case so as to have the portion of mutual adjacency with the first electrode terminal, and (c) applying the insulating coting material to the second electrode terminal and the second portion of the circuit pattern.

(Appendix 8)

A power conversion apparatus including:

a main conversion circuit including the semiconductor device according to any one of Appendices 1 to 6 and configured to convert power to be input and output thereof; and a control circuit configured to output a control signal for controlling the main conversion circuit to the main conversion circuit.

While the invention has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:

an insulating substrate having a circuit pattern formed on an upper surface thereof;

a semiconductor element mounted on the upper surface of the circuit pattern; and a plurality of electrode terminals each having one end portion bonded to the upper surface of the circuit pattern, wherein at least two of the electrode terminals each have portions that face each other that are coated with an insulating film having a thickness of less than 100 μm, and a distance between one of the portions of one of the electrode terminals and another of the portions of another of the electrode terminals closest to the one of the electrode terminals is less than 100 μm.

2. The semiconductor device according to claim 1, further comprising:

a base plate bonded to a lower surface of the insulating substrate; and a case fixed to a periphery portion of the base plate, wherein other end portions of the plurality of electrode terminals are formed integrally with the case.

3. The semiconductor device according to claim 1, further comprising:

a base plate bonded to a lower surface of the insulating substrate; and a case fixed to a periphery portion of the base plate; and a sealing material that seals inside of the case, wherein the insulating film is composed of an insulating coating material that bonds, the electrode terminals having the portions of the plurality of electrode terminals and the sealing material through noncovalent bonding.

4. The semiconductor device according to claim 3, wherein the insulating film covers the semiconductor element and one end portions of the electrode terminals having the portions of the plurality of electrode terminals.

5. The semiconductor device according to claim 1, wherein the insulating substrate includes a base plate, a resin insulating layer formed on an upper surface of the base plate, and the circuit pattern formed on an upper surface of the resin insulating layer, and is integrally molded.

6. The semiconductor device according to claim 1, wherein the semiconductor element is composed of a wide bandgap semiconductor containing silicon carbide or gallium nitride.

7. The semiconductor device according to claim 1, further comprising:

a case surrounding the insulating substrate and the semiconductor element, wherein the plurality of electrode terminals each have another end portion positioned outside the case.

8. A method of manufacturing the semiconductor device according to claim 4, wherein the plurality of electrode terminals includes a first electrode terminal having the portions and a second electrode terminal, and the semiconductor element includes a first semiconductor element and a second semiconductor element, the method comprising:

(a) applying the insulating coating material to the first electrode terminal in which one end portion is bonded on an upper surface of a first portion on which the first semiconductor element is mounted in the circuit pattern and an other end portion is bonded to the case, and the first portion of the circuit pattern;

(b) bonding one end portion of the second electrode terminal to an upper surface of a second portion on which the second semiconductor element is mounted in the circuit pattern, and bonding an other end portion to the case so as to have the portion with the first electrode terminal; and (c) applying the insulating coating material to the second electrode terminal and the second portion of the circuit pattern.

9. A power conversion apparatus comprising:

a main conversion circuit including the semiconductor device according to claim 1, the main conversion circuit comprising a DC/AC converter, AC/DC converter, or DC/DC converter; and a control circuit configured to output a control signal to the main conversion circuit, the control signal being configured to control the main conversion circuit.

* * * * *